United States Patent [19]
Genrich et al.

[11] Patent Number: 5,596,609
[45] Date of Patent: Jan. 21, 1997

[54] PARALLEL CASCADED INTEGRATOR-COMB FILTER

[75] Inventors: Thad J. Genrich, Aurora; Richard M. Davis, Littleton; Bruno A. Martinez, Denver, all of Colo.

[73] Assignee: Hughes Aircraft Company, Los Angeles, Calif.

[21] Appl. No.: 670,109

[22] Filed: Jun. 25, 1996

Related U.S. Application Data

[63] Continuation of Ser. No. 322,665, Oct. 13, 1994, abandoned.
[51] Int. Cl.$^6$ .................................................... H04B 1/10
[52] U.S. Cl. .................... 375/350; 364/724.01; 364/829
[58] Field of Search ............................. 375/346, 350; 364/724.01, 724.09, 724.1, 724.19, 572, 724.03, 733, 828–840; 323/280; 324/76.17; 327/167; 331/165, 166

[56] References Cited

U.S. PATENT DOCUMENTS 5,212,659  5/1993  Scott et al. ........................ 364/724.1
5,323,391  6/1994  Harrison ............................. 370/70
5,327,133  7/1994  Greene ............................... 341/143

OTHER PUBLICATIONS

Riley et al, "High–Decimation Digital Filter", ICASSP '91: Acoustics, Speech & Signal Processing Conf. 1991. pp. 1613–1616.

*Primary Examiner*—Tesfaldet Bocure
*Assistant Examiner*—Bryan Webster
*Attorney, Agent, or Firm*—G. S. Grunebach; M. W. Sales; W. K. Denson-Low

[57] ABSTRACT

A high speed digital filter for use in digital interpolation and decimation provides a parallel processing implementation for integrator stages of a cascaded integrator-comb (CIC) filter. The parallel structure of the present invention is easily cascadeable since it allows subsequent integrator stages access to intermediate samples generated by preceding integrator stages. The parallel integrator structure may be implemented directly or may be reduced in complexity by removing redundant logic for use in decimator output sections or interpolator input sections. The parallel implementation of a CIC filter allows much higher sample rate filtering to be implemented with fewer standard CMOS logic devices than currently recognized implementations.

14 Claims, 7 Drawing Sheets

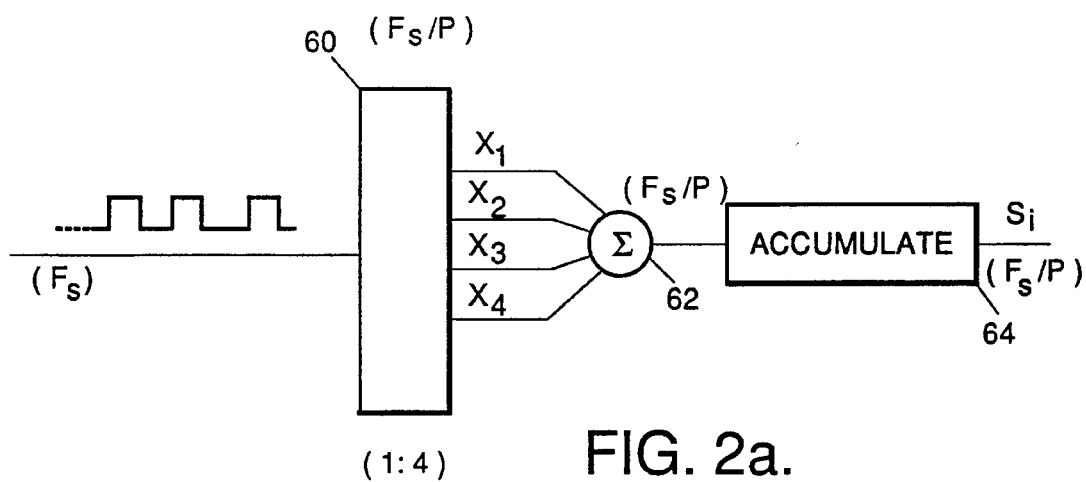
FIG. 2a.
FIG. 2b.
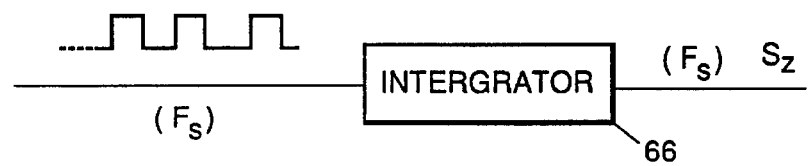
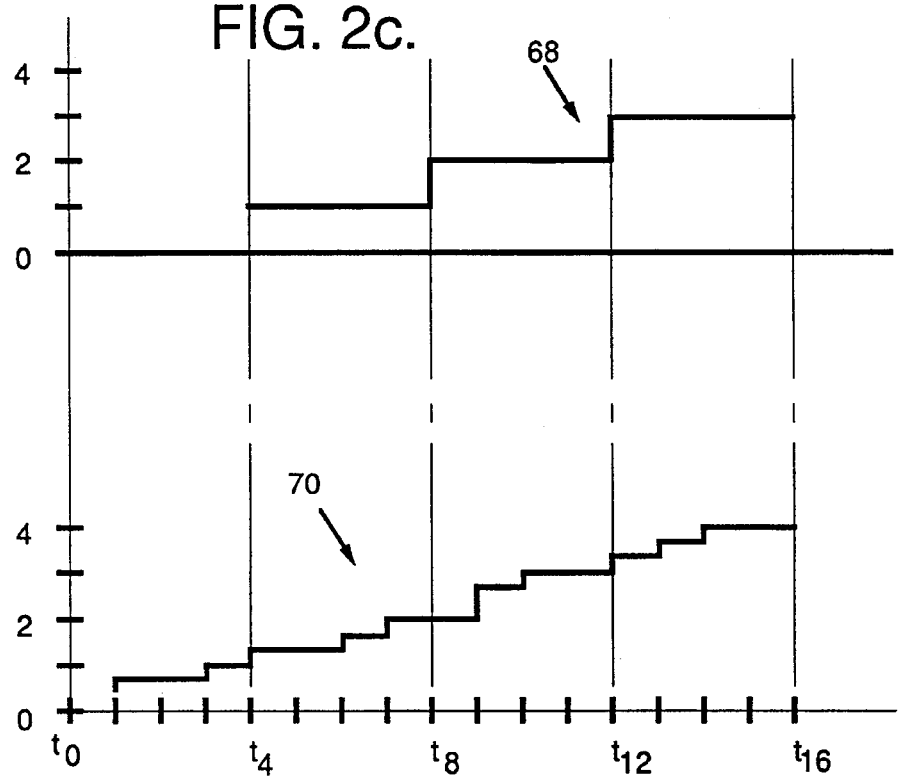
FIG. 2c.

5,596,609

PARALLEL CASCADED INTEGRATOR-COMB FILTER

This is a continuation of application Ser. No. 08/322,665, filed Oct. 13, 1994, abandoned.

TECHNICAL FIELD

The present invention relates to a digital filter for use in communication receivers which require a wide input bandwidth and a narrow output bandwidth.

BACKGROUND ART

A digital filter is a linear, time-invariant system which operates on a discrete input sequence (as opposed to an analog filter which operates on a continuous input) to determine a corresponding discrete output sequence. Filters, including digital filters, are often described in terms of a transfer function which characterizes the complex response of the filter to an impulse function input. Filters are utilized to select a desired band of frequencies from an input signal by substantially attenuating (ideally completely attenuating) all frequencies outside of the desired band, while passing those frequencies of interest substantially unattenuated (ideally completely unattenuated).

A filter may be generally classified by the nature of the frequencies which it passes without substantial attenuation. For example, a low-pass filter selects frequencies ranging from zero (DC) to a selected cutoff frequency; a bandpass filter selects frequencies between two (2) selected cutoff frequencies; and a notch filter or band-reject filter is complementary to a bandpass filter, i.e. it rejects (substantially attenuates) those frequencies between two (2) cutoff frequencies while passing all other frequencies.

Although ideal filters have discrete cutoff frequencies, practical filters can only approximate such a characteristic. The transition bandwidth characterizes the "sharpness" or "roll-off" of the filter transition between those frequencies which are attenuated and those which are passed. Thus, an ideal filter has a transition bandwidth of zero (step roll-off) whereas a practical, realizable filter has a transition bandwidth greater than zero.

In a typical signal processing application, a continuous signal is utilized to represent information of interest and transfer that information across a communication channel. Unfortunately, practical communication channels are subject to noise and interference (from the transmitted signal itself as well as from other transmitted signals) which tend to distort the signal as it passes over the channel. A communications receiver functions to reconstruct a reasonable facsimile of the original signal so that the information of interest contained in that signal may be ascertained at the receiving end.

A number of benefits are associated with employing a digital representation of a transmitted signal. For example, errors or distortions in the signal may be detected and/or corrected. Confidential information may be encrypted to reduce the likelihood of unauthorized interception and interpretation. The efficiency of the data channel may be increased by reducing or eliminating redundant information (data compression). Another advantage is that digital filters perform consistently over time and from unit to unit while providing immunity to temperature variations and power supply voltage variations. In addition, the evolution of integrated circuit technology and the associated advancements in digital microprocessor performance have facilitated complex manipulation of digital signals.

Due to the benefits available in processing digital signals, and that typical "real" signals are continuous in nature, it is necessary to convert the original continuous (analog) signal to a corresponding discrete (digital) signal. This function is performed by an analog to digital converter (ADC). The reverse process, conversion from a digital signal back to an analog signal, is performed by a digital to analog converter (DAC). Conversion from an analog to a digital signal is often accomplished by sampling the analog signal at predetermined time intervals. Preservation of the information contained in the original signal requires a predetermined minimum number of samples per unit time, i.e. a minimum sampling rate which is referred to as the Nyquist rate. If an ADC operates at a sampling rate substantially higher than the Nyquist rate, such as ten times the Nyquist rate, it is referred to as an oversampling ADC.

The sampling theorem provides a theoretical limitation on the minimum sampling rate required to uniquely reconstruct the original signal. In general, a signal having a finite bandwidth of $F_N$ (i.e. a bandlimited signal) can be reconstructed from samples taken at the Nyquist rate of $2F_N$. If the sampling theorem is not satisfied, spectral folding or aliasing occurs and the original signal can not be uniquely reconstructed from its samples. Thus, an anti-aliasing filter is used to limit the bandwidth of a signal before sampling to reduce aliases in the reconstructed signal. After sampling, each signal sample is represented by one of a number of discrete values during a process referred to as quantization.

In a number of applications, it is desirable to change the sampling rate of a discrete signal. For example, a signal sampled at a high sampling rate and represented using a one-bit quantization scheme, such as a delta modulated signal, may be converted to a multiple bit representation at a lower rate, such as a pulse code modulated (PCM) signal. The process of sampling rate reduction is referred to as decimation. The complementary process, interpolation, involves increasing the sampling rate. For example, a signal sampled at a low rate for efficient coding, such as an audio signal, may require a higher sampling rate to be modulated on a substantially higher carrier frequency for transmission across a communication channel.

Since decimation and interpolation are complementary functions, the structures utilized to perform those functions are analogous. Thus, data flow through such a structure in one direction would accomplish decimation while data flow in the opposite direction through the same structure would accomplish interpolation. Therefore, although the following disclosure focuses on a digital filter for use in decimation, it is equally applicable to an analogous filter for use in interpolation.

In typical communication systems, a baseband (low-frequency) signal is encoded (modulated) onto a bandpass signal (channel) having a higher carrier frequency since the modulated signal has better transmission characteristics. The higher frequency carrier has a wider bandwidth which allows a number of channels to be transmitted simultaneously. A number of encoding schemes may be utilized such as amplitude modulation (AM), frequency modulation (FM), or quadrature modulation (QM), among others. The modulated signal is then transferred from a transmitter to a receiver over a communication channel. The receiver may be tuned to select a particular channel of interest and demodulate the signal. A filter in the receiver, such as a digital filter, is utilized to recapture the original baseband signal.

The particular type of filter utilized depends upon the requirements of the particular application. Some applications may require a filter having a sharp roll-off while others may tolerate a wider transition bandwidth. Similarly, to minimize distortion, some applications may require a filter having a linear phase characteristic, i.e. a constant group delay independent of frequency. One type of filter which has selectable frequency characteristics and may be designed to have a linear phase characteristic is the finite impulse response (FIR) filter. Typical FIR filters are implemented with an array of multipliers to multiply various coefficients by consecutive input samples to achieve an overall desired frequency response. Thus, FIR filters require relatively complex circuitry (or software) and significant power to implement.

Another type of filter which requires less computation to implement than a FIR filter with a similar frequency response is an infinite impulse response (IIR) digital filter. However, these filters typically do not have a linear-phase response and are more susceptible to undesirable characteristics resulting from finite wordlengths utilized for implementation.

An alternative type of digital filter which provides a frequency response acceptable for decimation and interpolation applications is the cascaded integrator-comb (CIC) filter. This filtering technique may be implemented with significantly simpler logic than analogous FIR digital filters. For example, a CIC filter utilizes an array of adders and little data storage rather than the more complex multipliers and sizeable data storage required for a FIR filter. The reduced number of logic gates required for implementation improves efficiency and requires significantly less power. The CIC filtering technique is described in detail by Hogenauer, E. B. in "An Economical Class of Digital Filters for Decimation and Interpolation": IEEE Transactions on Acoustics, Speech and Signal Processing, Volume ASSP-29, No. 2, April 1981, pp. 155–162, which is hereby incorporated by reference in its entirety. However, the serial implementation of a CIC filter described by Hogenauer and implemented in a commonly available integrated circuit has a sampling rate limited to around 32 million samples per second (MSPS).

DISCLOSURE OF THE INVENTION

It is, therefore, an object of the present invention to provide a digital filter for use in decimation applications which allows an input sampling rate greater than 200 MSPS.

Another object of the present invention is to provide a digital filter for use in a communication receiver requiring a wide input bandwidth and a narrow output bandwidth.

Still another object of the present invention is to provide a parallel implementation of a CIC filter for use in decimation and interpolation applications.

A further object of the present invention is to provide a parallel implementation of a CIC filter which eliminates redundant logic to achieve greater chip efficiency in implementation.

Still another object of the present invention is to provide a parallel cascaded integrator-comb (PCIC) filter which utilizes a bit sliced fully pipelined architecture to increase adder and accumulator speeds.

Yet another object of the present invention is to provide a PCIC filter for use in decimation and interpolation applications which may be implemented with commercially available field programmable gate arrays (FPGA).

In carrying out the above objects and other objects and features of the present invention, a digital filter is provided for use in decimation and interpolation of digital signals. The digital filter includes a comb section cascaded to an integrator section which is characterized by at least one parallel integrator stage for receiving a plurality of parallel signals and producing at least one output signal representing an integration of at least two of the plurality of parallel signals.

The above objects and other objects, features, and advantages of the present invention will be readily appreciated by one of ordinary skill in the art from the following detailed description of the best mode for carrying out the invention when taken in connection with the accompanying drawings.

BRIEF DESCRIPTION OF THE DRAWINGS

FIGS. 2a–2c illustrate a non-cascadeable parallel integrator structure;

BEST MODE(S) FOR CARRYING OUT THE INVENTION

Figure 1A:
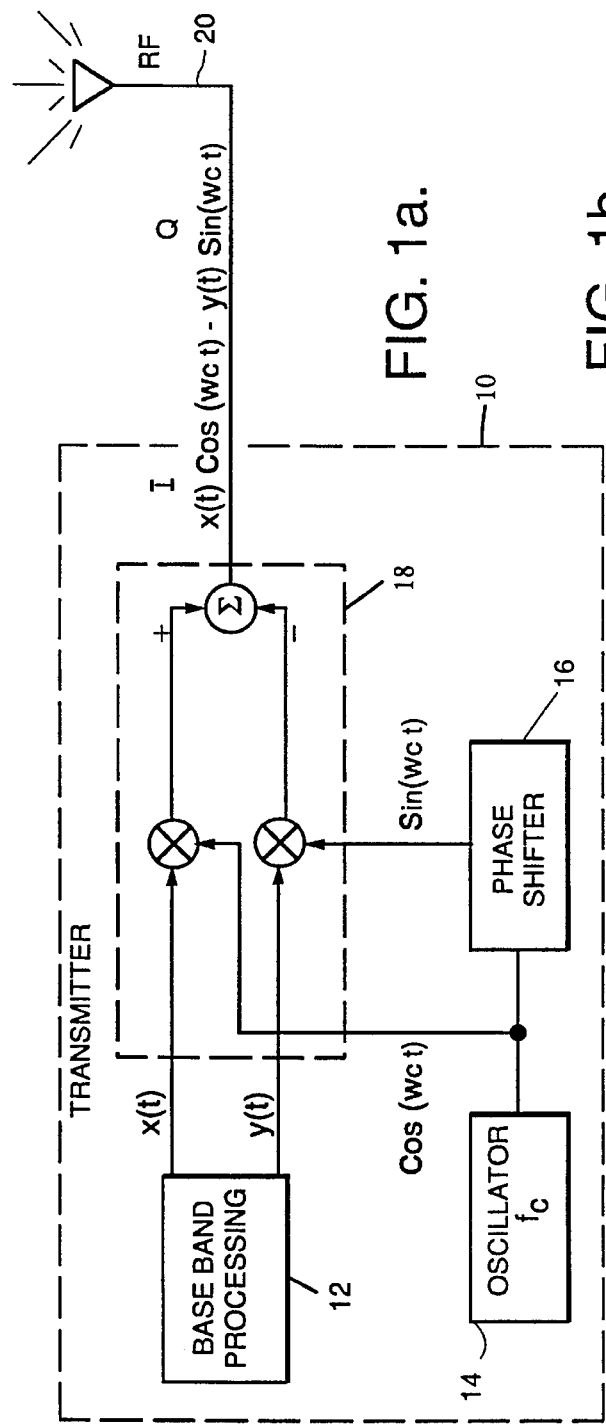
FIGS. 1a and 1b are block diagrams of a representative communication system including a receiver having a digital parallel cascaded integrator-comb (PCIC) filter according to the present invention.
Figure 1B:
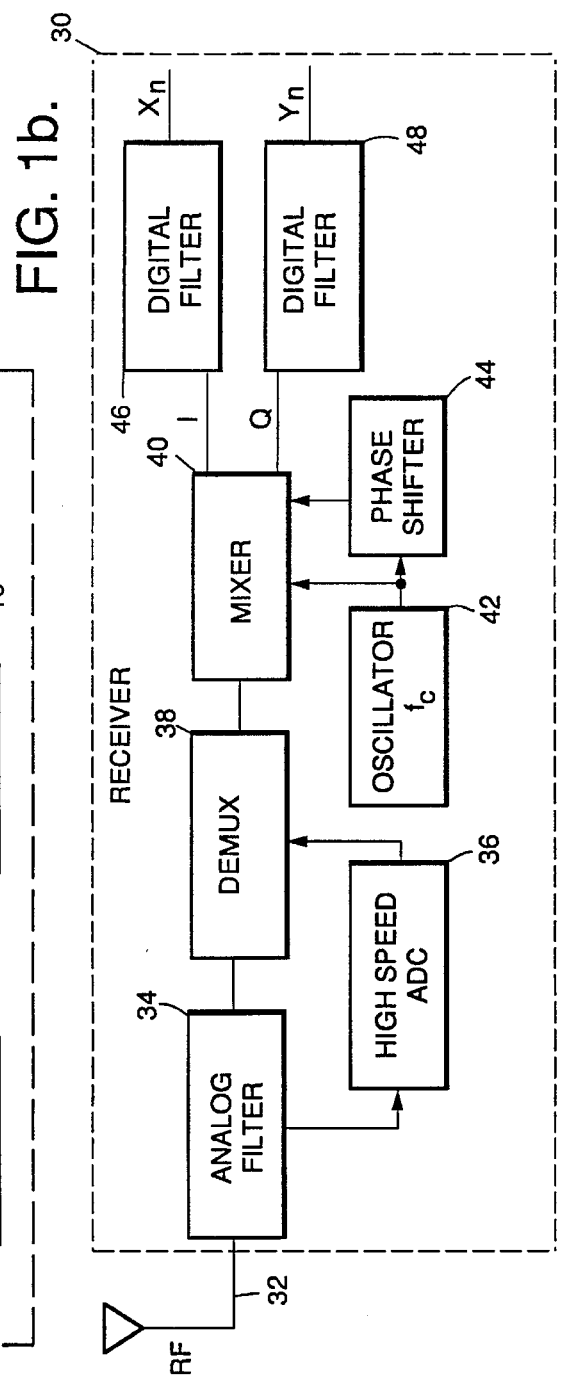

Referring now to FIGS. 1a and 1b, block diagrams illustrate a representative communication system including a receiver having a digital filter constructed in accordance with the present invention. Transmitter 10 of FIG. 1a utilizes quadrature modulation (also referred to as in-phase and quadrature or I and Q modulation) to transmit a signal over a communication channel. Transmitter 10 includes baseband processing circuitry 12 which generates and/or processes a baseband signal having time-varying components x(t) and y(t). Oscillator 14 generates a sinusoidal carrier signal (represented by $\cos(w_c t)$) at a carrier frequency $f_c$ (where $w_c = 2\pi f_c$). A phase shifter 16 imparts a 90° phase shift to the oscillator signal to produce a shifted oscillator signal.

With continuing reference to FIG. 1a, the oscillator signals (shifted and unshifted) are multiplied by the baseband signal components y(t) and x(t), respectively, by mixer 18. The components are summed to produce a complex modulated in-phase and quadrature radio-frequency (RF) signal for transmission via antenna 20 over a communication channel. Of course, FIG. 1a is only a conceptual illustration of a generalized transmitter. In practice, transmitter 10 may include a number of other functional blocks which are not specifically illustrated, such as amplifiers, filters, multiplexers, and the like. Furthermore, transmitter 10 may transmit an analog signal as illustrated or may implement a digital transmission scheme as previously described.

Referring now to FIG. 1b, receiver 30 receives an RF signal transmitted over a communication channel via antenna 32. In some applications, an optional tunable analog filter 34 pre-filters the received RF signal to ease requirements of other system components such as high speed analog-to-digital converter (ADC) 36 and digital filters 46 and 48. High-speed ADC 36 converts the received analog RF signal to a digital signal which is demultiplexed by DEMUX 38. Mixer 40 separates the demultiplexed signal into its in-phase and quadrature components utilizing oscillator signals generated by oscillator 42 and phase shifter 44. Of course, a direct digital synthesizer having sine and cosine outputs could be utilized in place of oscillator 42 and phase shifter 44. Digital filters 46 and 48 are low-pass PCIC filters for generating digital sequences which may be utilized to reconstruct the original baseband signal components x(t) and y(t).

Since CIC decimating filters perform integration at the higher sampling rate and differentiation at the lower sampling rate (only a fraction of the higher rate), the integration operation limits the speed of the filter. Thus, a parallel implementation of the integration function increases the speed of the filter so that input sampling rates exceeding 200 MSPS are attainable. Thus, in the following description, it is assumed that the differentiation functions are implemented using standard design techniques, such as those detailed in the article by E. B. Hogenauer referenced above.

A single stage parallel integrator could be constructed as indicated in FIG. 2a by summing a number of parallel inputs and integrating the sum. As shown in FIG. 2a, a digital signal at frequency $F_s$ provides the input to a serial to parallel converter 60 which provides output signals $x_1$ to $x_4$ to summing block 64 at a frequency of $F_s/P$, Where P=4. Accumulator 64 keeps a running total of sums (to provide the integration function) which is output as sum $S_1$. The value of sum $S_1$ corresponding to the parallel structure of FIG. 2a is illustrated graphically in FIG. 2c and indicated generally by reference numeral 68. As shown, the structure of FIG. 2a generates an output sequence $S_1$ equivalent to every 4th (Pth) output sample of the output sequence $S_2$, indicated generally by reference numeral 70. As shown in FIG. 2b, output sequence $S_2$ is generated by a single stage integrator 66 operating at the serial sampling rate $F_s$.

The parallel integrator approach illustrated in FIG. 2a is not amenable to a multiple-stage implementation since a second stage integrator would not have access to each of the intermediate samples that would be generated by a first stage integrator operating at the serial sample rate $F_s$. For example, the second stage integrator would not have access to sample values occurring between times $t_0$ and $t_4$. Since many applications require a multiple-stage integrator implementation to achieve desired frequency response characteristics, a parallel structure as illustrated in FIG. 2a would not be suitable for such applications.

Figure 3:
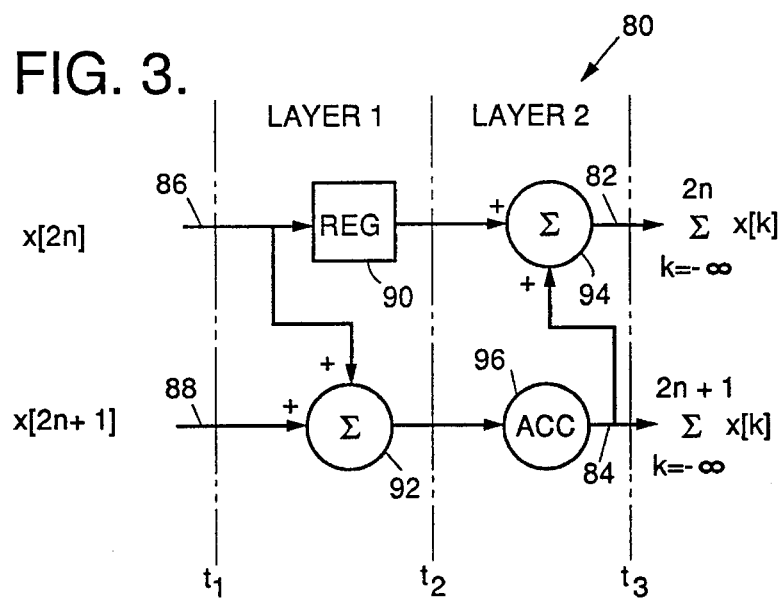
FIG. 3 is a block diagram of a single stage cascadeable parallel integrator with a sample width of two for use in a PCIC filter according to the present invention.

Referring now to FIG. 3, a block diagram of a single stage cascadeable parallel integrator is shown. The block diagram of FIG. 3, as well as the block diagrams of FIGS. 4–8, depict synchronous data flow from left to right through the various layers of filter elements as delineated by times $t_1$ to $t_x$. Parallel samples depicted in the figures are arranged so that the first sample of the group is at the top of the diagram and the last sample is at the bottom of the diagram.

Returning now to FIG. 3, parallel integrator stage 80 is particularly suited for use in a PCIC filter constructed in accordance with the present invention. This parallel structure overcomes the limitation of the structure illustrated in FIG. 2a by generating two (2) outputs 82 and 84. Output 82 corresponds to the state of an integrator (such as integrator 66 of FIG. 2b) operating at the serial sample rate $F_s$ after the first sample $x_{[2n]}$, arriving at input 86, has been processed. Output 84 corresponds to the state of another integrator operating at the serial sample rate $F_s$ after both the first sample $x_{[2n]}$ arriving at input 86 and the second sample $x_{[2n+1]}$ arriving at input 88 have been processed.

With continuing reference to FIG. 3, register 90 provides a delay equal to that imposed by summing block 92 so that data flow through the various stages is synchronous. Summing block 94 adds the accumulated sum generated by accumulator 96 and the current (delayed) sample $x_{[2n]}$ to produce the output sequence indicated. Similarly, the output sequence produced at output 84 represents the integral of the input stream including the latest sample $x_{[2n+1]}$ received.

The adder functions performed by blocks 92 and 94, and the accumulator function performed by block 96 are implemented with pipelined synchronous devices consisting of input adders coupled to output flip flops. The highest adder and accumulator speeds can be achieved through the use of a bit sliced, fully pipelined architecture. In this approach, only one pipelined single bit addition is performed by each adder per clock cycle, which minimizes adder logic delays. The least-significant bit (LSB) is processed during the first cycle, the next bit is processed during the next cycle, etc. Register block 90 is provided so that the pipeline delay of output 82 matches the pipeline delay of output 84. Of course the adder functions may have alternative implementations utilizing various levels of pipelining for particular applications.

Disadvantages of a fully pipelined single bit sliced architecture include the necessity of skewing input data so that the LSB can be processed first. After processing, the output data must be de-skewed to reconstruct the original bit order. This strategy also requires additional internal flip flops to pipeline the carry bits through the adders. The impact of skewing and de-skewing data may be reduced by increasing the number of operations performed while the data is skewed. These disadvantages are outweighed, however, by the increased operating speed which lowers the number of parallel samples P required to meet predetermined operating parameters.

The complexity of the implementation of the structure illustrated in FIG. 3 depends upon the number of parallel bits (B) being processed by summing blocks 92 and 94. If one full adder and one flip flop per adder (or accumulator) bit is assumed, this structure requires 3B full adders and 4B flip flops per integrator stage. A serial integrator would require only 1B flip flops and 1B adders to implement. Thus, this particular implementation provides a cascadeable integrator at the cost of additional logic.

Figure 4:
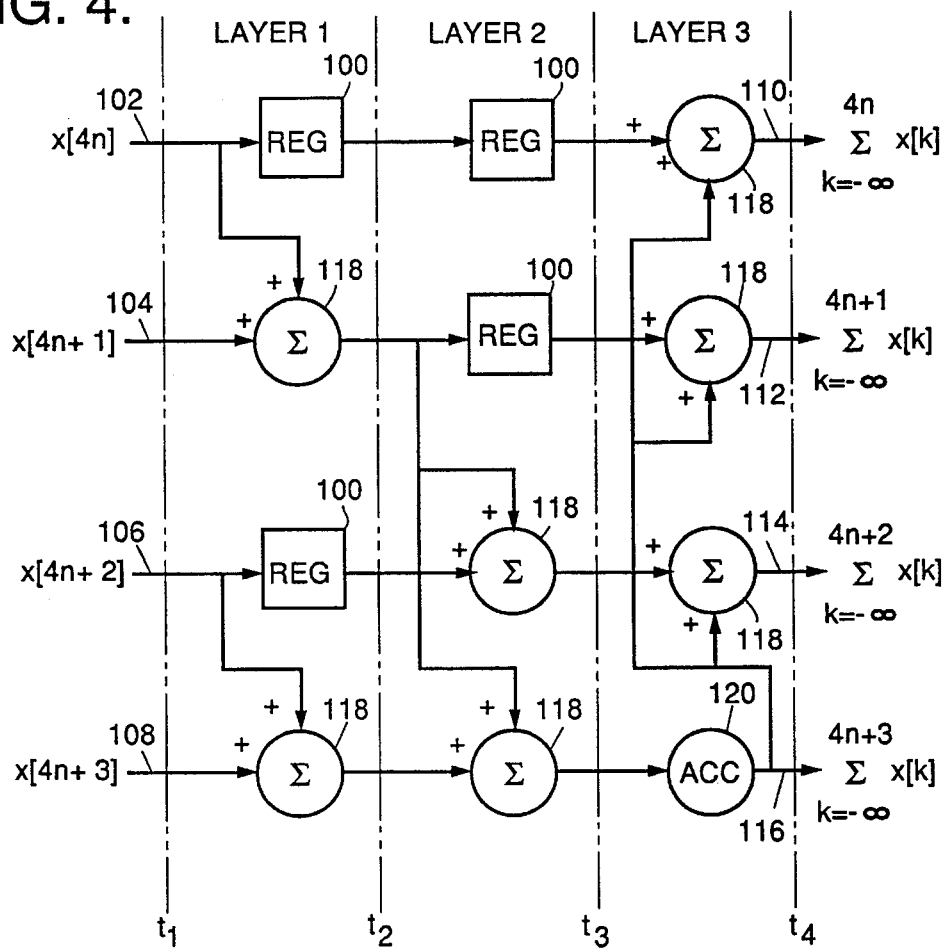
FIG. 4 is a block diagram of a single stage cascadeable parallel integrator with a sample width of four for use in a PCIC filter according to the present invention.

A block diagram of a single stage cascadeable parallel integrator with a sample width of four is shown in FIG. 4. This structure extends the concept illustrated in FIG. 3 which utilized only two (2) layers of filter elements to a three (3) layer structure which accommodates a larger sample width. Similar function blocks operate in an analogous fashion in FIGS. 3 and 4. For example, registers 100 are used to match the pipeline delay from inputs 102–108 to outputs 110–116. Similarly, output 110 corresponds to the state of an integrator operating at the serial sample rate $F_s$ after the first sample $x_{[4n]}$ arriving at input 102 has been processed. Output 116 corresponds to the state of an integrator operating at the serial sample rate $F_s$ after all four input samples have been processed. Blocks 118 compute the sum of their corresponding inputs while accumulator 120 functions as an integrator by keeping a running total sum which is input to appropriate summing blocks 118, as illustrated. Similar to the structure of FIG. 3, the adder and accumulator functions are performed by pipelined synchronous devices consisting of input adders coupled to output flip flops.

The parallel structure illustrated in FIG. 4 requires 8B full adders and 12B flip flops per integrator stage. For comparison to serial implementations, the complexity of the parallel implementations may be normalized by dividing the number of adders and flip flops required by the sample width of the structure. As summarized in the following table, the results indicate that normalized complexity increases with sample width. Thus, the growth in complexity places practical limitations on the efficiency of the PCIC filter for increasingly larger sample widths.

TABLE 1

Integrator Complexity Growth

| Sample Width | Full Adders | Flip Flops | Normalized Full Adders | Normalized Flip Flops |
| --- | --- | --- | --- | --- |
| 1 | 1B | 1B | 1.0B | 1.0B |
| 2 | 3B | 4B | 1.5B | 2.0B |
| 4 | 8B | 12B | 2.0B | 3.0B |
| 8 | 20B | 32B | 2.5B | 4.0B |
| $2^n$ | $\{2^n(n+2)/2\}$B | $\{2^n(n+1)\}$B | $\{(n+2)/2\}$B | $(n+1)$B |

Thus, the parallel integrator structure of the present invention may be extended to accommodate a generalized sample width P of $2^n$, although other implementations may be more efficient. The resulting structure will be characterized by a total of (n+1) layers and require $\{2^n(n+2)/2\}$B full adders and $\{2^n(n+1)\}$B flip flops as indicated in Table 1.

A convenient arrangement for the elements in the first layer (input layer) of a generalized structure includes P/2 summing blocks with the same number of alternating delay registers interposed therebetween, as illustrated in FIG. 4 for P=4. All subsequent layers except the output layer also include P/2 summing blocks and P/2 delay registers. A convenient arrangement for the second layer includes alternating groups of two (2) delay registers and two (2) summing blocks as also illustrated in FIG. 4. For P=8 (not illustrated), a third layer may be formed by alternating groups of four (4) delay registers and four (4) summing blocks, etc. The last layer (output layer) includes (P−1) summing blocks and a single accumulator.

Figure 5:
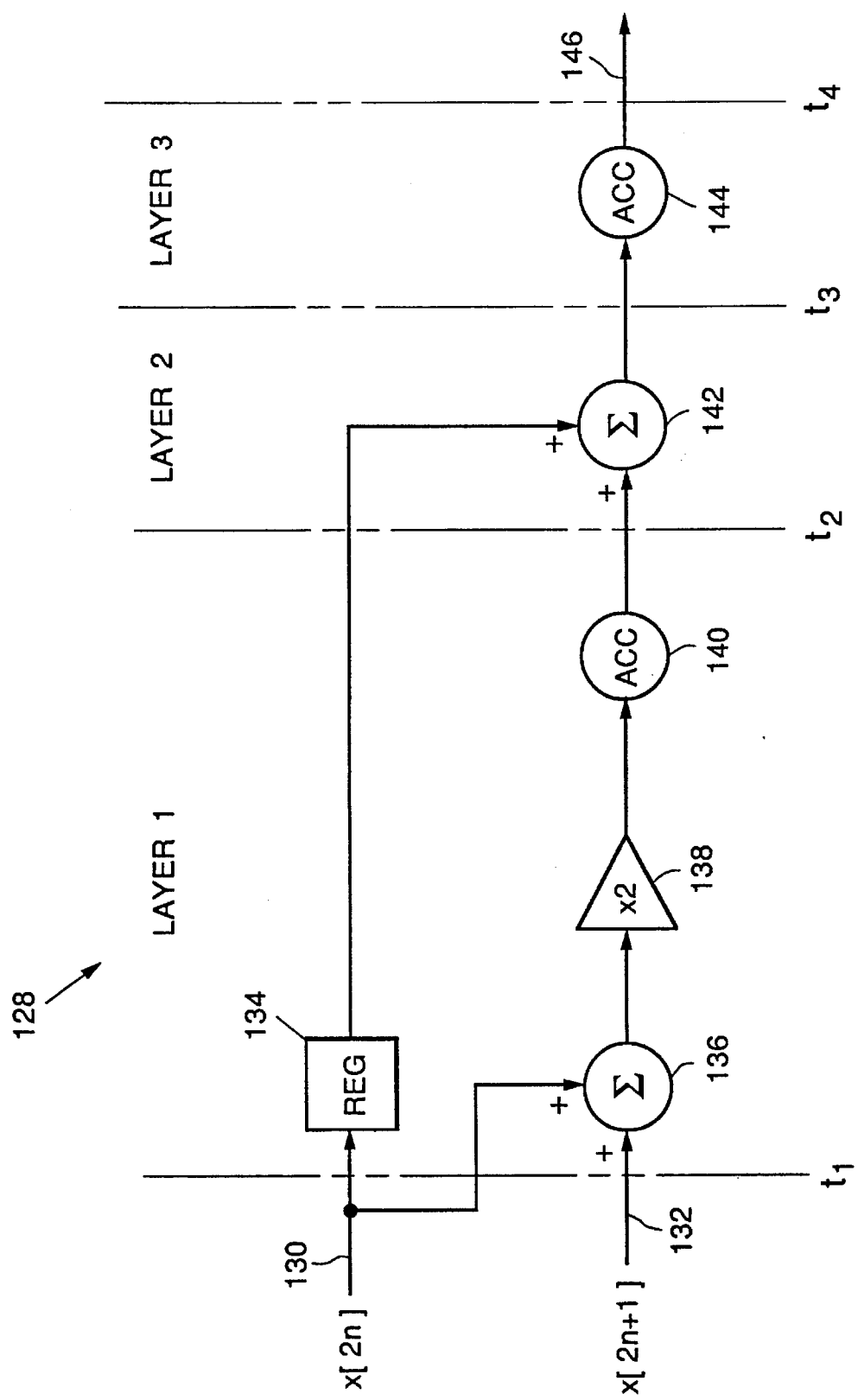
FIG. 5 is a block diagram of a two-stage, two-sample width parallel implementation of a decimator output section with reduced redundancy according to the present invention.

Referring now to FIG. 5, a block diagram of a two-stage, two-sample width parallel implementation of a decimator output section is shown. Although a decimating filter output section is illustrated, similar gains in efficiency may be realized at the input of an interpolating integrator. The structures illustrated in FIGS. 5 and 6, as well as the following description assume that the sampling rate reduction ratio R is limited to nonzero integer multiples of the number of parallel samples P, i.e. R/P is an integer. For example, if four (4) parallel samples (P=4) are utilized, the sampling rate at the input of the decimator divided by the sampling rate at the output of the decimator (the sampling rate reduction ratio R) is limited to 4n, where n is a nonzero integer. Of course, it may be possible to implement PCIC decimating and interpolating filters with a non-integer R/P relationship, however similar efficiency gains may not be realized.

As described above, CIC decimating filters have a lower sampling rate at the output of the integrator than at the input of the integrator. Thus, given an integer R/P relationship, only one output of the final integrator stage will be sampled since the other outputs were generated only for the benefit of subsequent stages (of which there are none). Assuming the output sample is the last of every P samples, the remaining output samples do not have to be generated for the last stage. For example, assume the parallel structure illustrated in FIG. 4 comprises the last stage of a multiple-stage PCIC filter. Output 116 is the last of the four (4) output samples to be generated so that the remaining output samples corresponding to outputs 110–114 do not have to be generated. Pruning of functions responsible for generating those outputs results in greater overall implementation efficiency.

Implementation efficiency can be improved even further by examining the output sequence and designing an equivalent structure to produce that sequence. The various implementations generally require a varied number of processing functions.

Returning now to FIG. 5, an efficient parallel integrator output section for a decimating filter according to the present invention is shown. Output section 128 may follow a cascade of a number of parallel stages comprising parallel structures such as the parallel structure of FIG. 3. Inputs 130 and 132 receive consecutive samples $x_{[2n]}$ and $x_{[2n+1]}$, respectively. Register 134 functions to match the pipeline delay of the upper portion to the pipeline delay of the lower portion so that the inputs to summing block 142 arrive substantially simultaneously. Intuitively, it may appear that two (2) such registers are required although in practice one register 134 accomplishes this function.

With continuing reference to FIG. 5, the output of summing block 136 is multiplied by two at multiplier 138. Since the signal is a binary digital signal, this multiplication is implemented by a simple bit shift and requires no additional logic to construct, i.e. accomplished via appropriate wiring. The output of multiplier 138 is communicated to accumulator 140 before being summed with input sample $x_{[2n]}$ at summing block 142. This result is then passed to accumulator 144 which produces a discrete running sum at output 146. This implementation requires only 4B full adders and 5B flip flops. This is an improvement which saves 2B full adders and 3B flip flops over a functionally equivalent structure comprising two (2) cascaded sections constructed as shown in FIG. 3.

Figure 6:
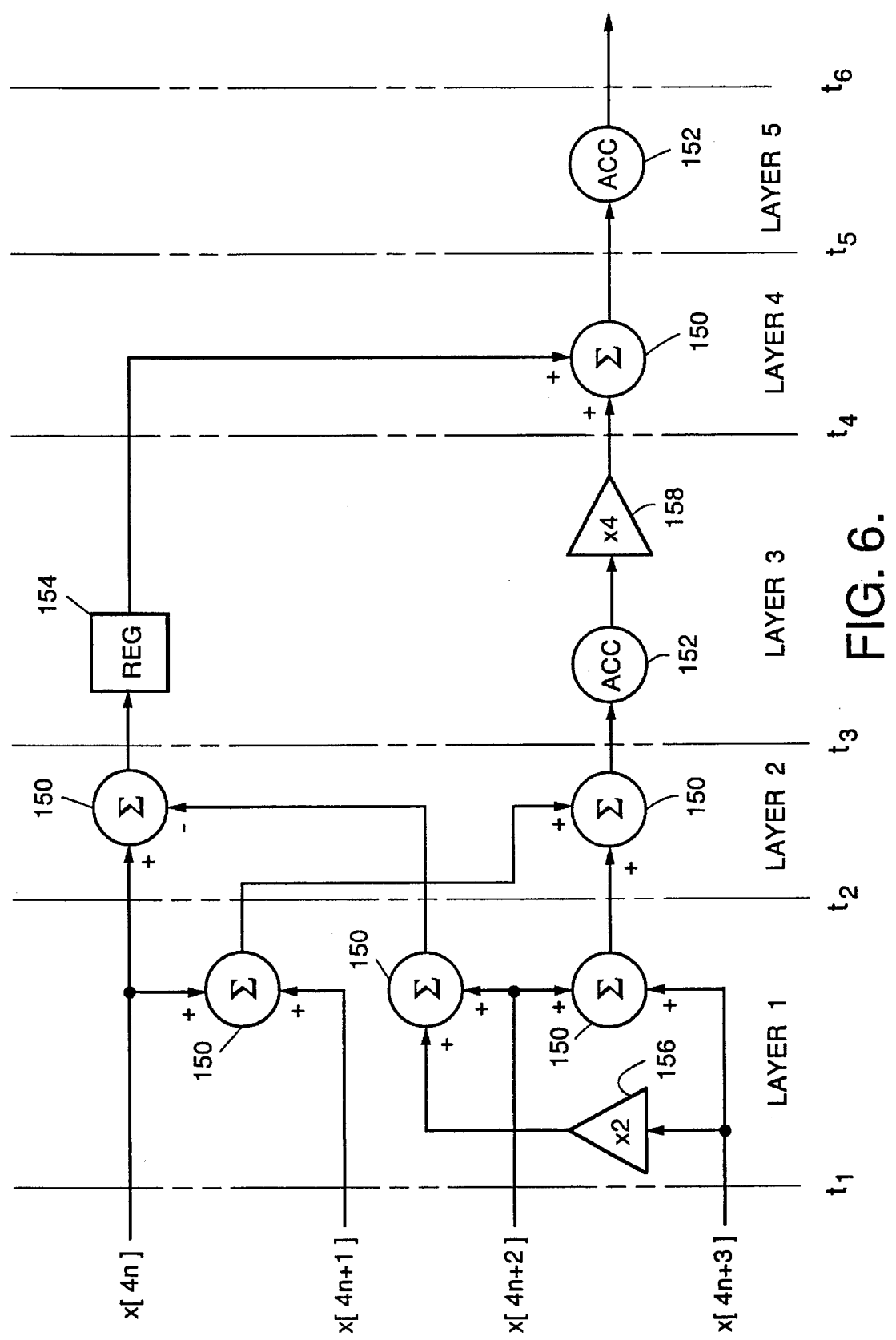
FIG. 6 is a block diagram of a two-stage, four-sample width parallel implementation of a decimator output section with reduced redundancy according to the present invention.

Referring now to FIG. 6, a block diagram of a two-stage, four-sample width parallel implementation of a decimator output section is shown. This output section may be used with a number of preceding cascaded parallel structures such as the parallel structure illustrated in FIG. 4.

The parallel output structure of FIG. 6 incorporates functional block pruning to achieve an efficient two-stage parallel integrator similar to that of FIG. 5, but having a sample width of four. As with the implementations described above, the summing blocks 150 and accumulators 152 are implemented with pipelined synchronous devices consisting of input adders coupled to output flip flops. Register 154 is provided to match the pipeline delay between the upper and lower data flow paths. Multiplier 156 is accomplished by a single bit shift while multiplier 158 requires a double bit shift so as to multiply by four. Thus, neither multiplier 154 nor multiplier 156 requires any additional logic.

The implementation illustrated in FIG. 6 requires only 8B full adders and 9B flip flops. This results in a savings of 8B full adders and 15B flip flops over a functionally equivalent implementation comprising two cascadeable integrators as illustrated in FIG. 4. However, extension of functional block pruning to filters employing a greater number of integrator sections yields diminishing improvements in implementation efficiency.

Figure 7:
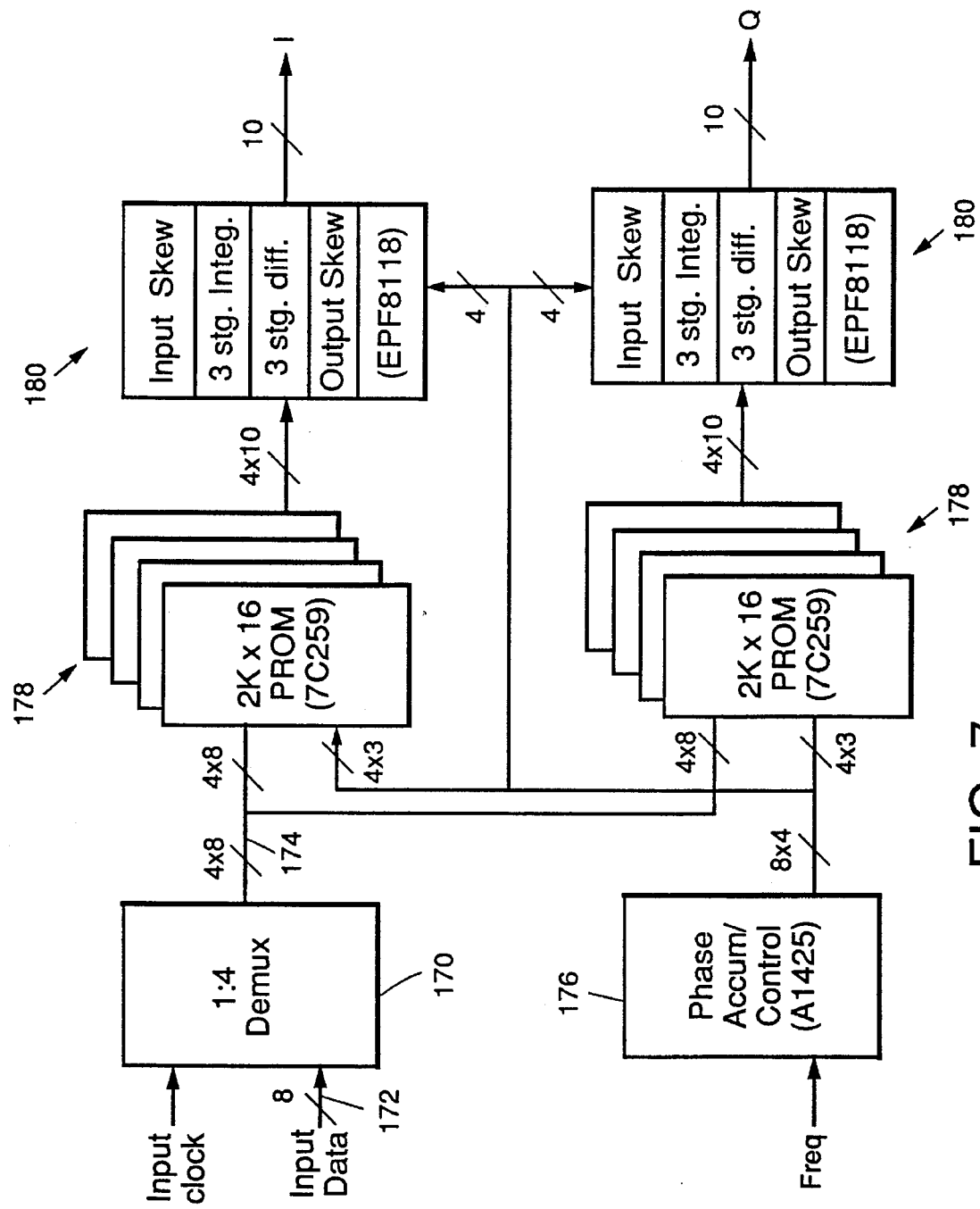
FIG. 7 is a block diagram of a three-stage tuner/decimator structure for use in a communication receiver capable of input sample rates exceeding 200 MSPS according to the present invention.

Referring now to FIG. 7, a block diagram of a three-stage tuner/decimator structure is shown. The structure illustrated provides for an input sampling rate of 240 MSPS and an output sampling rate of 30 MSPS. A 1:4 demultiplexer 170 converts the 240 MSPS, eight-bit input data arriving at input 172 into four-word parallel samples at 60 MSPS. Each of the four data words produced at output 174 also consists of eight data bits. Tuning is accomplished by phase generator 176 in cooperation with eight (8) programmable read-only memories (PROM's) 178. Preferably, each PROM of PROM's 178 is a 7C259 PROM affording 2 Kilo-words (K) of storage with each storage location accommodating a 16-bit data word.

With continuing reference to FIG. 7, preferably, phase generator 176 is implemented with an A1425 FPGA which realizes four (4) phase locked, five-bit phase accumulators. This provides a tuning resolution of 7.5 MHz (240 MSPS$\div 2^5$). Control logic within phase generator 176 generates 90° phase shifted versions of the accumulator outputs for PROM's 178 which function as mixers for the in-phase and quadrature components of the digital signal. As such, PROM's 178 contain the product of the eight-bit input data and the sine (or cosine) of the phase angle produced by phase generator 176. Thus, a look-up table is utilized instead of actually performing a more complicated multiplication. To reduce the amount of storage necessary, PROM's 178 contain only positive values. Therefore, if a negative value is required, the control logic within phase generator 176 instructs the appropriate PCIC filter 180 to invert the sample.

Since each PROM 178 has only 11 address bits corresponding to 2K of data storage, and eight of the 11 address bits must be used for data input, the 32 phase states generated by phase generator 176 must be encoded into the remaining 3 address bits (representing eight PROM states). The 32 phase states are assigned to be symmetric about the real and imaginary axes so that states from $+\pi/2$ to $+3\pi/2$ have the same sine/cosine values as states from $-\pi/2$ to $+\pi/2$. The control logic of phase generator 176 sequences the PROM addresses to implement this strategy.

With continuing reference to FIG. 7, the 10-bit parallel output words from PROM's 178 provide the input sequence for three-stage digital PCIC filters 180. Each PCIC filter 180 skews the input data to perform the pipelined bit sliced additions and accumulations as described above. The skewed data is operated on by a three-stage parallel integrator which reduces the sampling rate to the output sampling rate of 30 MSPS. The three-stage integrator is followed by a three-stage differentiator and output de-skewing to produce a single tuned 10-bit output stream for the in-phase (I) and quadrature (Q) components. The PCIC approach illustrated is efficient and simple enough to be implemented with commercially available FPGA's. Preferably, each PCIC filter 180 is implemented on an FPGA such as the Altera EPF81188.

Since only a three-stage PCIC filter is utilized, satisfactory performance of the tuner/decimator of FIG. 7 requires a tunable analog filter (34 of FIG. 1*a*), such as the MINI-30-90-4-SMA manufactured by Pole Zero. The tunable filter should precede the ADC (36 of FIG. 1*a*) to provide sufficient rejection of aliasing components. This improves loading of the ADC while also easing the requirements for the decimating filter. When utilized with such a tunable filter, the three-stage PCIC digital filter provides nearly 80 decibels (Db) of aliasing component rejection.

Figure 8:
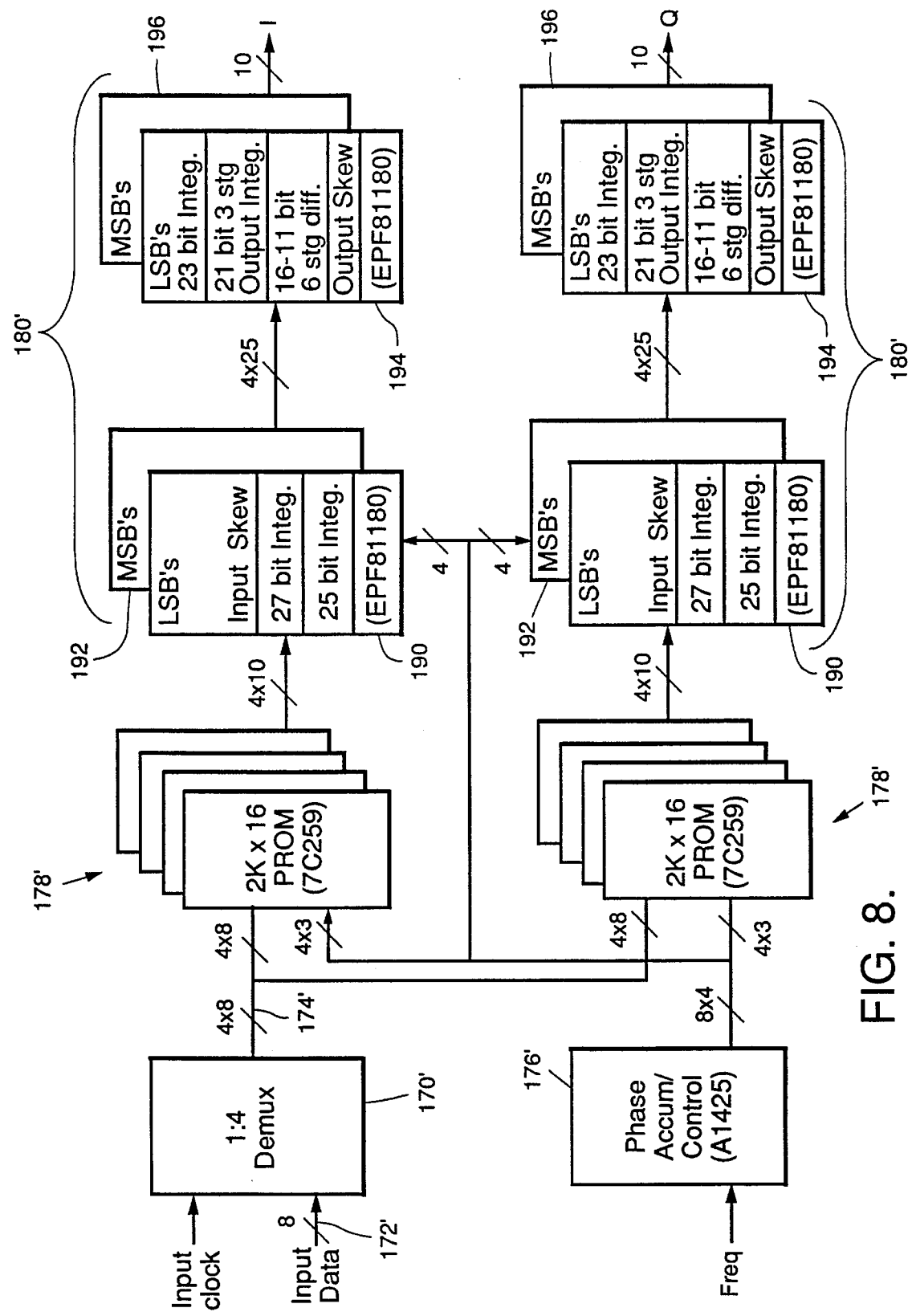
FIG. 8 is a block diagram of a six-stage tuner/decimator structure for use in a communication receiver capable of input sample rates exceeding 200 MSPS.

Referring now to FIG. 8, a block diagram of a six-stage tuner/decimator structure for use in a communication receiver is shown. The structure of FIG. 8 provides an input sampling rate of 240 MSPS, an output sampling rate of 30 MSPS, and provides more than 90 dB of aliasing component rejection without using a tunable analog filter prior to the ADC. The various components indicated with primed (xx') reference numerals perform a similar function to the corresponding unprimed reference numerals of FIG. 7. However, digital PCIC filter 180' is a six-stage filter as described below.

With continuing reference to FIG. 8, FPGA's 190 perform input skewing for the least significant bits (LSB's) of the 10-bit input data words. After input skewing, data passes through the first integrator stage which requires 27 bits to prevent integrator overflow (as explained in detail by Hogenauer, referenced above). Data then passes through a second integrator stage which only requires 25 bits to equalize the noise contribution of each integrator at the output while minimizing the logic required. Thus, two (2) LSB's are trimmed between the first and second integrator stages. FPGA's 192 perform input skewing and two (2) stages of integration for the most-significant bits (MSB's) of the input data words.

Still referring to FIG. 8, the 25-bit output of the second stage integrators is passed to FPGA's 194 and 196. Data flows through stage three of the integrators which requires 23 bits to equalize the round-off noise contribution at the output. Finally, a three-stage integrator output section requires only 21 bits. Data then passes through a six-stage differentiator which has a 16-bit input and an 11-bit output before being de-skewed. FPGA's 196 perform similar operations on the MSB's of the 25-bit input data words as those performed by FPGA's 194 on the LSB's of the input data words.

Of course, a number of various implementations of a digital PCIC filter according to the present invention are possible, other than those illustrated in FIGS. 7 and 8. For example, the tuning and mixing functions performed by phase generator 176 and PROM's 178 may be implemented within a single FPGA by actually performing the multiplications rather than utilizing a look-up table. Furthermore, as integrated circuits continue to evolve it is foreseeable that an increasing number of functions may be implemented within a single application specific integrated circuit (ASIC). Implementations utilizing hardware, software, firmware, or combinations thereof are also foreseeable with the continuing improvement of microprocessor operating speeds.

Thus, it is understood, that while the forms of the invention herein shown and described include the best mode contemplated for carrying out the invention, they are not intended to illustrate all possible forms thereof. It will also be understood that the words used are descriptive rather than limiting, and that various changes may be made without departing from the spirit and scope of the invention disclosed.

What is claimed is:

1. A cascadeable integrator for use in a digital filter which receives a series of data words each represented by a plurality of parallel data bits, the integrator for processing a predetermined number of the series of data words in parallel during each of a plurality of clock cycles, the integrator comprising:

a first layer, including at least one summing element and at least one delay element, for receiving the predetermined number of data words in parallel and generating a first sequence of parallel output data words in response thereto, the first sequence of parallel output data words being available to at least one subsequent layer; and at least one subsequent layer including at least one accumulator and at least one summing element, the at least one subsequent layer being connected to the first layer for generating a second sequence of parallel output data words, wherein each of the first sequence parallel output data words represents an integration of a unique sequence of previously received input data words so as to allow cascading of the integrator with subsequent parallel data word integrators.

2. The cascadeable integrator of claim 1 wherein the at least one summing element includes a first summing element for receiving two of the predetermined number of parallel input data words and generating a sum thereof; and wherein the at least one delay element includes a delay element for receiving one of the predetermined number of parallel input data words and providing a time delay to the one data word so that the at least one subsequent layer receives the first sequence of parallel output data words substantially simultaneously.

3. The cascadeable integrator of claim 2 wherein the at least one accumulator includes an accumulator in communication with the first summing element; and the at least one summing element further includes a second summing element in communication with the accumulator and the delay element.

4. The cascadeable integrator of claim 2 wherein the at least one subsequent layer comprises:

an accumulator in direct communication with the first summing element; and a second summing element in direct communication with the accumulator and the delay element.

5. The cascadeable integrator of claim 2 wherein the first summing element is a pipelined synchronous device.

6. A cascadeable integrator for use in a digital filter which receives a series of data words each represented by a plurality of parallel data bits, the integrator for processing a predetermined number of the series of data words in parallel during each of a plurality of clock cycles, the integrator comprising:

a first layer, including at least one summing element and at least one delay element, for receiving the predetermined number of data words in parallel and generating a first sequence of parallel output data words in response thereto, the first sequence of parallel output data words being available to at least one subsequent layer;

at least one subsequent layer including at least one accumulator and at least one summing element, the at least one subsequent layer being connected to the first layer for generating a second sequence of parallel output data words, wherein each of the first sequence parallel output data words represents an integration of a unique sequence of previously received input data words so as to allow cascading of the integrator with subsequent parallel data word integrators and wherein the at least one summing element of the first layer includes a pipelined synchronous device comprising:

at least one full adder for performing a single bit addition during each clock cycle; and at least one flip flop coupled to a corresponding one of the at least one full adders.

7. The cascadeable integrator of claim 1 wherein the first layer and the at least one subsequent layer each include a plurality of elements and wherein each of the plurality of elements of the first layer is directly connected to at least one of the plurality of elements in the at least one subsequent layer.

8. A cascadeable integrator for parallel processing a predetermined number of a first sequence of input data words each represented by a plurality of parallel data bits to produce a second sequence of parallel output data words, the integrator comprising:

a first layer having at least one summing element for receiving the predetermined number of parallel input data words and generating a plurality of sums, wherein each sum combines two of the parallel input data words; and at least one subsequent layer having at least one summing element and an accumulator, the at least one subsequent layer being connected to the first layer for combining the plurality of sums generated by the first layer to produce the second sequence of parallel output data words, wherein each of the parallel output data words represents an integration of a unique sequence of previously received parallel input data words so as to allow cascading of the integrator with subsequent integrators.

9. The cascadeable integrator of claim 8 for processing $2^N$ parallel input data words to produce $2^N$ parallel output data words, where N is a positive integer and wherein:

the at least one summing element of the first layer includes $2^{N-1}$ summing elements, the first layer also including $2^{N-1}$ delay elements; and the at least one subsequent layer includes one layer having $2^{N-1}$ summing elements and an accumulator, and N-1 layers each having $2^{N-1}$ summing elements and $2^{N-1}$ delay elements.

10. The cascadeable integrator of claim 9 wherein the summing elements are pipelined synchronous devices.

11. The cascadeable integrator of claim 9 wherein each summing element includes a pipelined synchronous device comprising:

at least-one full adder for performing a single bit addition during each clock cycle; and at least one flip flop coupled to a corresponding one of the at least one full adders.

12. A parallel integrator for use in a digital filter which receives a series of data words each including a plurality of parallel data bits and converts the series to a first sequence of parallel input data words, the integrator comprising:

a first layer for receiving the first sequence of parallel input data words and generating a second sequence of parallel data words, the first layer including a first summing element for generating a sum of two of the first sequence of parallel input data words, a multiplier for generating a product of the sum and a predetermined constant value, an accumulator for adding the product to previously generated products, and a delay element for providing a time delay to one of the first sequence parallel input data words so that the second sequence of parallel data words is received substantially simultaneously by at least one subsequent layer; and wherein the at least one subsequent layer is connected to the first layer for generating an output signal representing an integration of the previously received parallel input data words.

13. The parallel integrator of claim 12 wherein the at least one subsequent layer comprises:

a second layer including a second summing element in communication with the accumulator and the delay element; and a third layer including an accumulator in communication with the second summing element.

14. The parallel integrator of claim 12 wherein the at least one subsequent layer comprises:

a second layer including a fourth summing element for combining the output of the third summing element and one of the plurality of parallel input data words and a fifth summing element for combining the outputs of the first and second summing elements;

a third layer including a delay element in communication with the fourth summing element, an accumulator in communication with the fifth summing element for generating an accumulated sum, and a multiplier for generating a product of the accumulated sum and a predetermined constant;

a fourth layer including a sixth summing element for combining the output of the delay element and the product; and a fifth layer including an accumulator in communication with an output of the sixth summing element.

* * * * *